United States Patent [19]

Yabu et al.

[11] Patent Number: 4,905,064
[45] Date of Patent: Feb. 27, 1990

[54] SEMICONDUCTOR MEMORY DEVICE HAVING STACKED-CAPACITOR TYPE MEMORY CELLS

[75] Inventors: Takashi Yabu, Yokohama; Taiji Ema, Kawasaki, both of Japan

[73] Assignee: Fujitsu Limited, Kawasaki, Japan

[21] Appl. No.: 275,646

[22] Filed: Nov. 23, 1988

Related U.S. Application Data

[63] Continuation of Ser. No. 827,102, Feb. 7, 1986, abandoned.

[30] Foreign Application Priority Data

Feb. 9, 1985 [JP] Japan ................................. 60-022768

[51] Int. Cl.$^4$ ............................................. H01L 29/78
[52] U.S. Cl. ..................................... 357/23.6; 357/51; 357/54
[58] Field of Search ........................... 357/23.6, 51, 54

[56] References Cited

U.S. PATENT DOCUMENTS 4,151,607  4/1979  Koyanagi et al. ................... 365/174
4,649,406  3/1987  Takemae et al. ................. 357/54 X

FOREIGN PATENT DOCUMENTS 0112670   4/1984  European Pat. Off. .
55-154762 12/1980  Japan .
60-231357 11/1985  Japan .

OTHER PUBLICATIONS

Gdula, R. "Composite Dielectric Layer" IBM Tech. Disc. Bull., Feb. 1972, p. 2609.
Tsang, P. et al., "Fabrication of High-Performance LDDFET's with Oxide Sidewall-Spacer Technology" IEEE Trans On Elec. Dev., Apr. 1982, pp. 590-596.
Electronics, vol. 56, No. 17, Aug. 25, 1983, pp. 135-137, New York, U.S.; M. C. Smayling et al.: "256-K Dynamic RAM is More Than Just an Upgrade".
IEEE Transactions on Electron Devices, vol. ED-27, No. 8, Aug. 1980, pp. 1596-1601, New York, U.S.; M. Koyanagi et al. "A 5 V only 16-kbit Stacked-Capacitor MOS RAM".
Patent Abstracts of Japan, vol 5, No. 27 (E-46) [699], Feb. 18, 1981; & JP A 55 154 762 (Cho LSI Gijutsu Kenkyu Kumiai) 02,12,1980.

Primary Examiner—Andrew J. James
Assistant Examiner—Sara W. Crane
Attorney, Agent, or Firm—Staas & Halsey

[57] ABSTRACT

A semiconductor memory device including a plurality of stacked-capacitor type memory cells, each having a capacitor storing data and a transfer-gate transistor transferring data to the capacitor. The transistor includes a gate connected to a word line and formed by an insulating layer, and source and drain regions. Each of the memory cells has a first insulating layer covering the gate of the transfer-gate transistor.

The capacitor in each memory cell includes a second insulating layer covering another word line adjacent to the one word line and having a larger thickness perpendicular to a plane of a substrate than that of the first insulating layer covering the gate, a second conductive layer which is in contact with one of the source and drain regions of the transistor, extends over the gate through the first insulating layer and covers the second insulating layer, a third insulating layer formed on the second conductive layer, and a third conductive layer extending over the third insulating layer.

The semiconductor memory device also includes an additional conductive layer directly connected to the other of the source and drain regions of the transistor in the memory cell and extending over the gate of the adjoining transistors through said first insulating layer convering thereon. Each bit line is connected to the other of the source and drain regions through the additional conductive layer.

The semiconductor memory device further includes a peripheral circuit including transistors, each having source and drain regions and a gate electrode which is entirely covered by the second insulating layer. The source and drain regions are directly connected to wiring lines.

Also disclosed is a method for manufacturing a semiconductor memory device having the above construction.

8 Claims, 14 Drawing Sheets

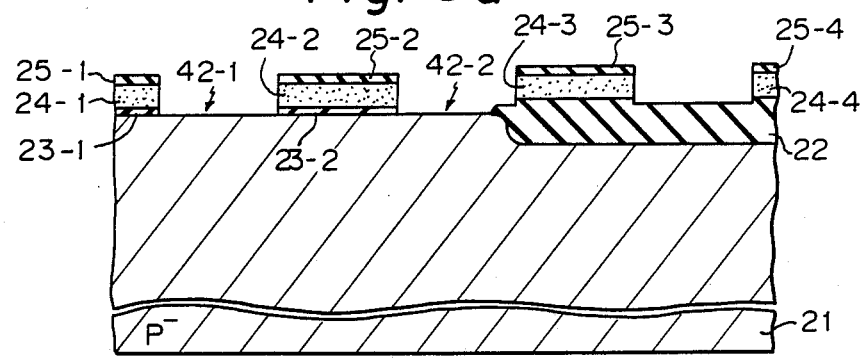
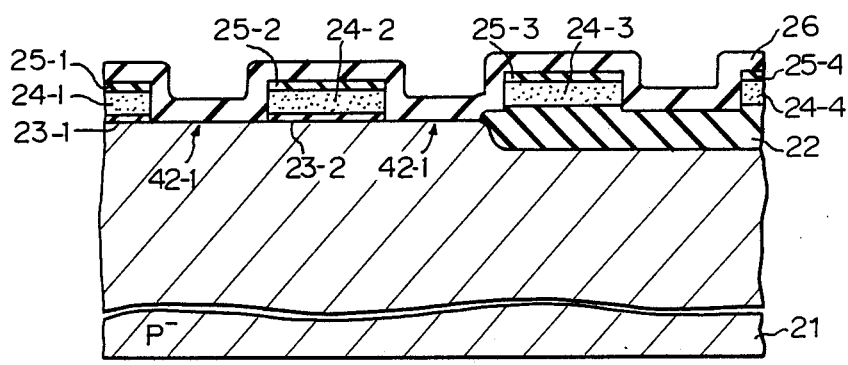
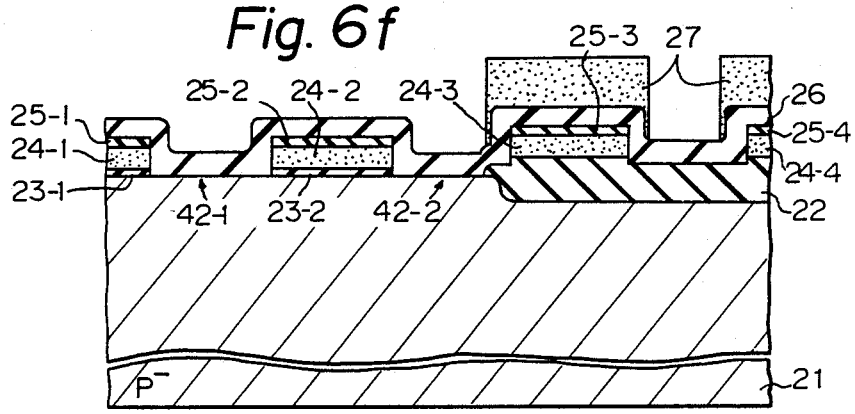

SEMICONDUCTOR MEMORY DEVICE HAVING STACKED-CAPACITOR TYPE MEMORY CELLS

This is a continuation of Ser. No. 827,102, filed 2/7/86, now abandoned.

MIS memory cells of a one-transistor one-capacitor type are now in use in MIS dynamic memory devices and a fine lithographic technology has been developed to reduce the size of the elements of each memory cell, thereby obtaining a large capacity, highly integrated semiconductor device. However, there is a limit to the high integration and large capacity that can be obtained by size reduction alone. In addition, a size reduction of the memory cells, and accordingly, a reduction in the capacity of memory capacitors, increases the generation rate of soft errors due to radioactive rays. The shortening of a channel length in transistors also increases the occurrence of harmful effects due to hot electrons and hot holes.

To improve memory cells of a one-transistor one-capacitor type, stacked-capacitor type memory cells have been proposed (see: Technical Digest of the Institute of Electronics and Communication Engineers of Japan, SSD80-30, 1980, July). Each stacked-capacitor type memory cell includes a transfer-gate transistor, which is the same as that of the conventional memory cell, and a capacitor, which is an electrode extending over a thick field-insulating layer, a counter electrode extending over its own transfer-gate transistor, and an insulating layer therebetween, thereby increasing the capacitance of the capacitor.

Japan Unexamined Patent Publication (Kokai) No. 55-154762, published on Dec. 2, 1980, discloses a semiconductor memory device having stacked-capacitor type memory cells, each of which includes a capacitor formed by a dielectric layer and two opposing conductive layers on the surfaces thereof placed above a transistor region for increasing the capacitance of the capacitor while maintaining a high integration.

The prior art, however, is disadvantaged by a low integration and lack of reliability, etc. These disadvantages will be discussed later with reference to a specific example.

SUMMARY OF THE INVENTION

An object of the present invention is to provide a stacked-capacitor type semiconductor memory device wherein the stacked-capacitors have an increased capacitance, and including highly integrated memory cells.

Another object of the present invention is to provide a stacked-capacitor type semiconductor memory device less liable to short-circuits between bit lines and word lines.

Still another object of the present invention is to provide a stacked-capacitor type semiconductor memory device less liable to bit line breakage.

Yet another object of the present invention is to provide a method of manufacturing the above stacked-capacitor type semiconductor devices.

According to one aspect of the present invention, there is provided a semiconductor memory device including: a substrate, a plurality of word lines; a plurality of bit lines, and a plurality of memory cells, each positioned at an intersection defined by one of the word lines and one of the bit lines and including a capacitor storing data and a transistor operatively connected to the capacitor and transferring data to the capacitor. The word lines are formed by a first conductive layer. The transistor in each memory cell includes a gate connected to one of the word lines, a gate insulating layer, and source and drain regions. Each memory cell has a first insulating layer covering the gate of the transistor and a second insulating layer covering another word line adjacent to the one word line and having larger thickness than that of the first insulating layer covering the gate. The capacitor in each memory cell includes a second conductive layer which is in contact with one of the source and drain regions of the transistor in the memory cell, extends over the gate of the transistor through the first insulating layer and covers the second insulating layer, a third insulating layer formed on the second conductive layer, and a third conductive layer extending over the third insulating layer. Each bit line is connected to the other of the source and drain regions of the transistor in each of the memory cell. The semiconductor memory device also includes an additional conductive layer directly connected to the other of the source and drain regions of the transistor in the memory cell and extending over the gate of the adjoining transistors through the first insulating layer covering the gate. Each bit line is connected to the other of the source and drain regions through the additional conductive layer.

The semiconductor memory device further includes a peripheral circuit including transistors, each having source and drain regions and a gate electrode which is entirely covered by the second insulating layer. The source and drain regions are directly connected to wiring lines.

According to another aspect of the present invention, there is provided a method for manufacturing a semiconductor memory device having the above construction.

BRIEF DESCRIPTION OF THE DRAWINGS

Other objects and features of the present invention will be described below with reference to the accompanying drawings, in which:

FIGS. 6a to 6l are sectional views explaining the production of the semiconductor memory device shown in FIG. 5;

DESCRIPTION OF THE PREFERRED EMBODIMENTS

Before describing the preferred embodiments of the present invention, an explanation will be given of the prior art for reference.

Figure 1:
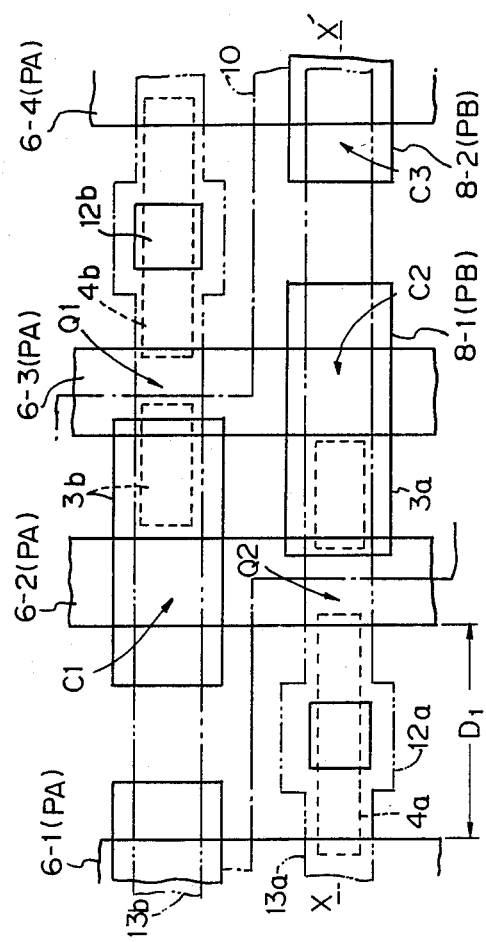
FIG. 1 is a plane view of a prior art semiconductor memory device having stacked-capacitor type memory cells.
Figure 2:
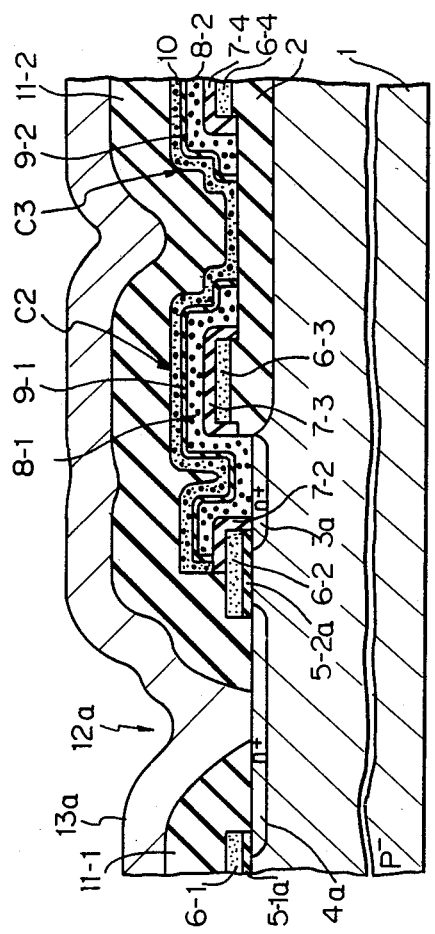
FIG. 2 is a sectional view of the semiconductor memory device shown in FIG. 1, taken along a line X—X'.

FIG. 1 is a plan view of a prior art semiconductor memory device. FIG. 2 is a sectional view of the semiconductor memory device shown in FIG. 1, taken along a line X—X'. The semiconductor memory device is a stacked-capacitor type memory device, more particularly a folded bit-line type semiconductor memory device as shown by the equivalent circuit diagram in FIG. 3.

Figure 3:
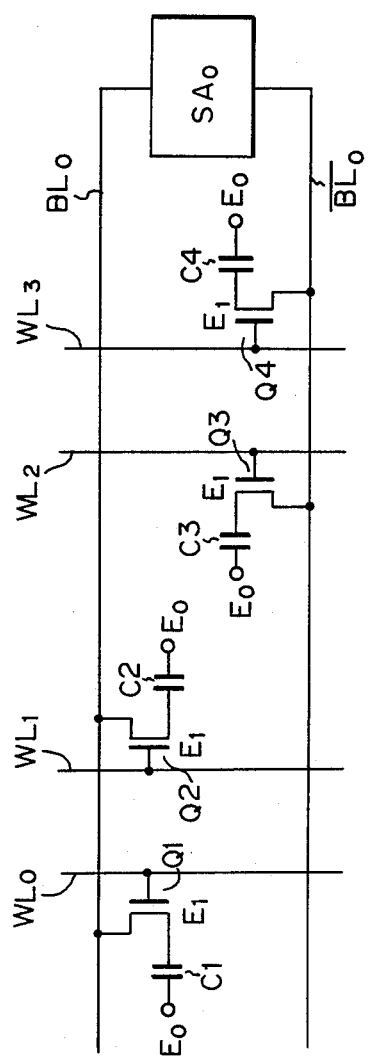
FIG. 3 is an equivalent circuit diagram of the device shown in FIGS. 1 and 2.

Generally, in a dynamic-type memory-cell configuration, two types of systems are known; the folded bit-line type and the open bit-line type. The former type has a pair of bit lines $BL_0$ and $\overline{bl_0}$, as shown in FIG. 3, arranged in parallel with each other. Specifically, the bit line $\overline{bl_0}$ is folded through a sense amplifier $SA_0$. The folded bit-line type memory device has a higher immunity to noise than the open bit-line type, because the voltage difference between the bit lines $BL_0$ and $\overline{bl_0}$ is not affected by the noise voltage.

In FIG. 3, references $Q_1$ to $Q_4$ designate transfergate transistors, $C_1$ to $C_4$ capacitors, $E_0$ and $E_1$ electrodes for each capacitor, and $WL_0$ to $WL_3$ word lines. Each memory cell consists of a capacitor and transfergate transistor and is arranged at an intersection defined by the bit line BL or $\overline{bl}$ and the word line WL.

In FIGS. 1 and 2, the folded bit-line type semiconductor memory device includes a $p^-$-type silicon substrate 1, a field silicon oxide film 2, an $n^+$-type diffusion region 3a functioning as a drain of the transfer-gate transistor $Q_2$, and an $n^+$-type diffusion region 4a functioning as a source of the transfer-gate transistor $Q_2$. The semiconductor memory device also includes gate oxide layers 5-1a and 5-2a, each being a gate of the transfer-gate transistor, first to fourth word lines 16-1 to 16-4, formed as first conductive layers and made of, for example, polycrystalline silicon PA, and first insulating layers 17-2 to 7-4 covering the first conductive layers. The semiconductor memory device further includes electrodes 8-1 and 8-2 for the capacitors, formed as second conductive layers and made of, for example, polycrystalline silicon PB, second insulating films 9-1 and 9-2 of dielectric material, and electrode 10, formed as a third conductive layer and made of polycrystalline silicon PC. In addition, the semiconductor memory device includes layer insulation films 11-1 and 11-2a, contact window 12a, and a bit line 13a of, for example, aluminum.

In FIG. 2, the second insulating films 9-1 and 9-2, disposed between the opposed second and third conductive layers 8-1 (8-2) and 10, both functioning as electrodes, function as the capacitors $C_2$ and $C_3$. Note that the capacitors are formed in vacant spaces which extend above the adjoining word lines, in a stack form, and have a considerably large area. This large area ensures a considerably large capacitance when the semiconductor memory device is further integrated, and avoids a reduction of the gate length of the transfer-gate transistor. This increases the immunity to soft errors due to alpha ($\alpha$) rays and harmful effects due to hot electrons and hot holes.

The semiconductor memory device, however, still suffers from the following disadvantages.

A further improvement is required in the capacitance of the capacitors in the semiconductor memory device, without increasing the area occupied by the capacitors, together with an improved integration and density of the semiconductor memory device.

In addition, the connection of the bit line 13a with the second $n^+$-type diffusion region 4a, which acts as the source of the transfer-gate transistor when the read operation is effected or the drain of the transfer-gate transistor when the write operation is effected, is achieved by means of the contact window 12a. The contact window 12a is formed on the diffusion region 4a by the mask aligning with the fourth insulating layer 11. In other words, the contact window 12a must be apertured at a portion between the word lines 16-1 and 6-2. In this regard, positional space margin of the mask alignment must be considered.

To prevent the connection between the bit line 13a and he word lines 16-1 and/or 6-2 by inadvertent removal of the layer insulation film 11 and the insulating layer adjacent to corners of the word lines 16-1 and 6-2 during etching, etc., the distance $D_1$ between the adjoining word lines 16-1 and 6-2 formed by polycrystalline silicon layer PA must be further increased and, of course, the length of the diffusion region 4a must be increased. As clearly understood from the above description, this will interfere with the desired high integration.

Further, the contact window 12a is deep and this tends to form a large step around the window, which increases the probability of breakage of the bit line 13a. The aforementioned Japanese Unexamined Patent Publication No. 55-154762 discloses a stacked type memory cell device in which a polycrystalline silicon pad is formed within the bit line contact area under the bit line to lessen the step around the contact window. This alleviates the problem of bit line breakage due to the step.

However, this memory cell structure is not effective for reducing the marginal distance needed to prevent inadvertent short-circuits between the bit line 12a and the word lines 16-1 and 6-2 around the contact window.

An embodiment of the semiconductor memory device in accordance with the present invention will now be explained.

Figure 4:
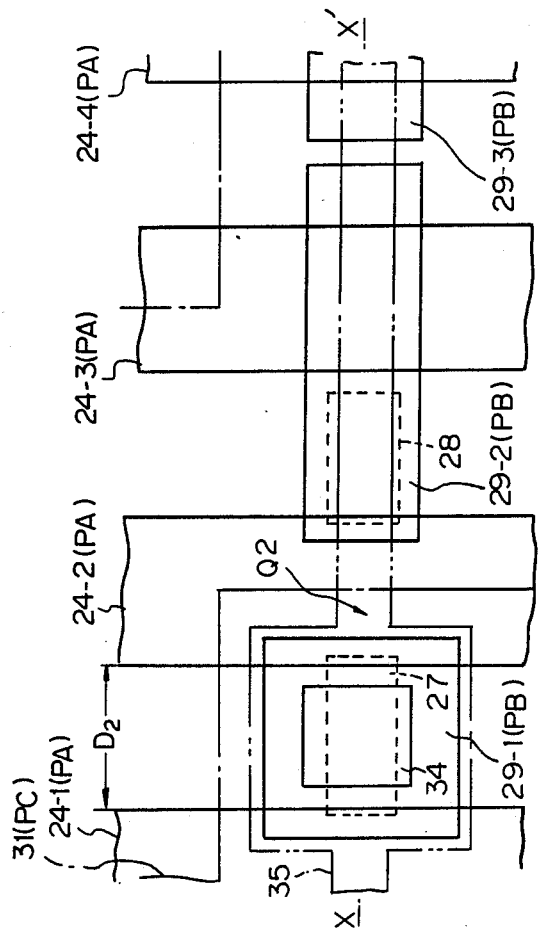
FIG. 4 is a plane view of an embodiment of a semiconductor memory device having stacked-capacitor type memory cells in accordance with the present invention.
Figure 5:
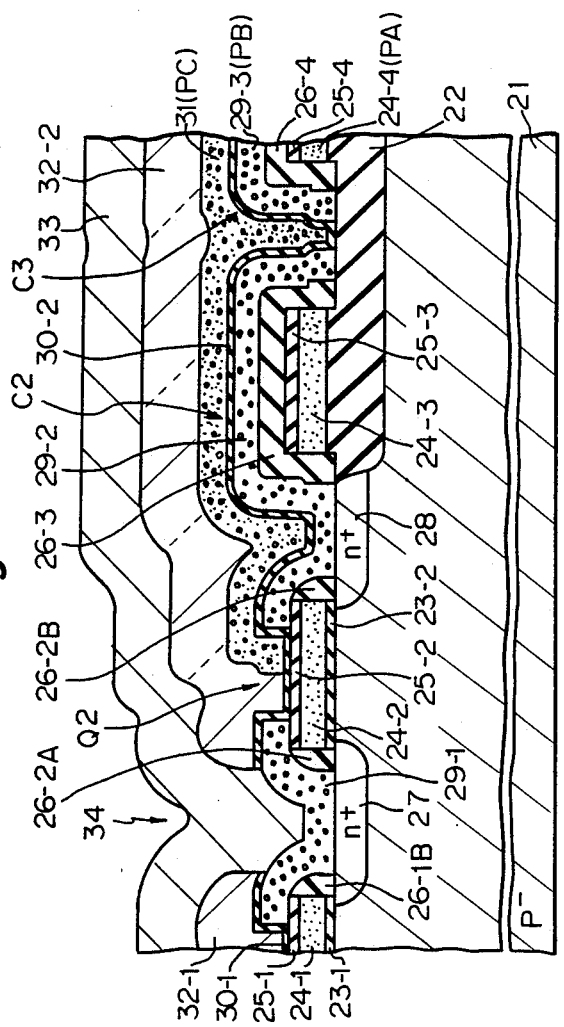
FIG. 5 is a sectional view of the semiconductor memory device shown in FIG. 4, taken along the line X—X-' in FIG. 4.

FIG. 4 is a plane view of the embodiment of the semiconductor memory device according to the present invention. FIG. 5 is a sectional view of the semiconductor memory device, taken along a line X—X' shown in FIG. 4. The semiconductor memory device is also a stacked-capacitor and folded bit-line type semiconductor memory device, as shown by the equivalent circuit in FIG. 3.

In FIGS. 4 and 5, the semiconductor memory device includes a $p^-$-type silicon substrate 21, a field silicon oxide film 22, an $n^+$-type diffusion region 28, an $n^+$-type diffusion region 27, and gate oxide layers 23-1 and 23-2 having a normal thickness approximately 400 Å (40 nm) to 500 Å (50 nm). The diffusion regions 27 and 28 and gate oxide layers 23-1 and 23-2 form a transfer-gate transistor $Q_2$.

The semiconductor memory device also includes first conductive layers 24-1 to 24-4, each having an $n^+$-type conductivity, made of polycrystalline silicon layer PA, and having a thickness of approximately 3000 Å° (300 nm) to 5000 Å (500 nm), and functioning as a word line and also as a gate electrode of the transfer-gate transistor with the cell area, and first insulating films 25-1 to 25-4 covering each word line 24 made of silicon oxide (SiO₂) or silicon nitride (Si₃N₄), and having a thickness of approximately 2000 Å (200 nm). The construction set forth above substantially conforms to that shown in FIGS. 1 and 2.

The semiconductor memory device further includes second insulating layers 216-1A (not shown) and 216-1B covering sides of the conductive layer 24-1, 26-2A and 26-2B covering sides of the conductive layer 24-2, 26-3 covering the conductive layer 24-3 and the first insulating layer 25-3, and 26-4 covering the conductive layer 24-4 and the first insulating layer 25-3. The insulating layers 26-3 and 26-4 above the conductive layers 24-3 and 24-4 function as dielectric films for forming the capacitors C2 and C3.

The semiconductor memory device includes second conductive layers 29-1 to 29-3 having an n⁺-type conductivity, a thickness of approximately 1000 Å (100 nm) to 3000 Å (300 nm), and made of polycrystalline silicon PB, directly connected to the diffusion region 28 and functioning as one electrode for a capacitor, third insulating films 30-1 and 30-2 of silicon oxide or silicon nitride having a thickness of approximately 200 Å (20 nm) to 300 Å (30 nm) and also functioning as a dielectric film for forming the capacitors C2 and C3, and a third conductive layer 31 having an n⁺-type conductivity, a thickness of approximately 1000 Å to 3000 ° and made of polycrystalline silicon PC, and functioning as another electrode for the capacitor. A capacitor means consisting of the electrodes 29-2 and 29-3 and 31 and the capacitive elements 26-3 and 216-4, and 30-2 and 30-3 is arranged above the surface of the substrate in a stacked form. Other capacitor means can be further stacked, if required.

The semiconductor memory device further includes an island-form conductive layer 29-1. The island-form conductive layer 29-1 is made of a polycrystalline silicon layer formed simultaneously with the second conductive layers 29-2 and 29-3 through a common deposition and patterning process. Accordingly, the layer 29-1 has a thickness of approximately 1000 Å (100 nm) to 3000 Å (300 nm). The island-form conductive layer 29-1, on one hand, is directly connected to the diffusion region 27 and, on other hand, extends over the word lines 24-1 and 24-2 with the insulating films 25-1 and 25-2 and the insulating films 216-1B and 26-2A interposed therebetween. Reference 34 designates a contact window.

In FIG. 5, the island-form conductive layer 29-1 may be formed separately of the second conductive layers 29-2 and 29-3. It may be, however, advantageously formed in the same process of forming the second conductive layers 29-2 and 29-3, as will be explained later.

The semiconductor memory device includes layer insulation films 32-1 and 32-2 of, for example, phosphosilicate glass (PSG) having a thickness of approximately 8000 Å (0.8 μm) to 10000 Å (1 μm), a bit line 33 of, for example, aluminum, and a protective layer 35 of, for example, phosphosilicate glass.

The bit line 33 is in direct contact with the island-form conductive layer 29-1 at the contact window 34, nd thus comes into electric contact with the diffusion region 27 indirectly.

In FIG. 5, the second insulating layers 26-3 and 6-4 are provided above the word lines 24-3 and 24-4 in addition to the first insulating layers 25-3 and 25-4, respectively. The word lines 24-2 and 24-4 correspond to the word line 6-3 and 6-4 in FIG. 2. The insulating layers 25-3 and 25-4 correspond to the insulating layers 7-3 and 7-4. The thickness of the insulating layers 26-3 and 26-4 is 6000 ° Å(0.6 μm), as set forth above. This results in an increment of the capacitance of each stacked capacitor of approximately 10 to 20 percent, without increasing the area occupied in plane.

In addition, the n⁺-type impurity diffusion regions 27 and 28, which are the source and drain of the transfer-gate transistor, are formed in a so-called self-alignment manner, as will be described later with reference to FIGS. 6a to 6l. This self-alignment allows a position margin and facilitates the manufacture of the semiconductor memory device.

Furthermore, the conductive layers 24-1 and 24-2 as the word lines are covered by the insulating layers 216-1A and 216-1B, and 26-2A and 26-2B, at the sides thereof, respectively. Provision of the side insulating layers 216-1B and 26-2A prevents contact with the conductive layers 24-1 and 24-2, and the island-form conductive layer 29-1 as well as the bit line 33. As a result, a distance $D_2$ between the conductive layers 24-1 and 24-2 may be made shorter than the distance $D_1$ shown in FIG. 1, thereby obtaining a higher integration of the semiconductor memory device.

Due to the provision of the island-form conductive layer 29-1, the depth of the bit line 33 at the contact window 34 may be reduced, reducing the possibility of a breakage of the bit line 33 at the contact window 34, and accordingly, improving the reliability of the device.

The manufacturing method of the semiconductor memory device shown in FIGS. 4 and 5 will now be explained with reference to FIGS. 6a to 6l.

Figure 6A:
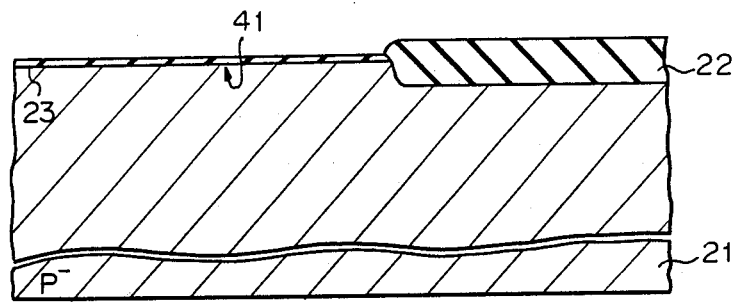

In FIG. 6a, first, the field silicon oxide layer 22 of silicon oxide (SiO₂) and having a desired thickness is formed on the p⁻-type silicon semiconductor substrate 21 having a predetermined specific resistance by a normal selective oxidation process. Then the silicon oxide layer 22, which is used as a mask during the above selective oxidation process, is removed to expose an active region 41 in which the transfer-gate transistor may be formed. Next, the gate oxide insulating layer 23 is formed on the transfer-gate transistor forming region 1. 41 by a thermal oxidation process. The thickness of the gate oxide insulating layer 23 is approximately 400 Å (40 nm) to 500 Å(50 nm).

Figure 6B:
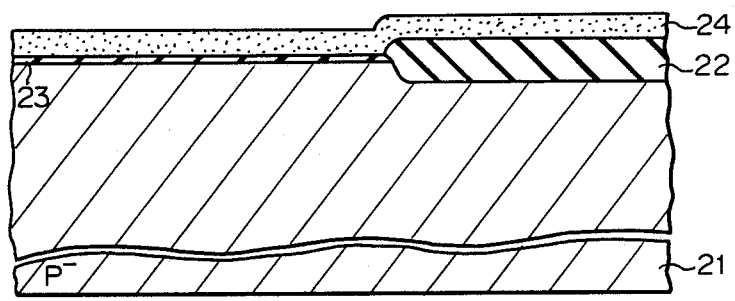

In FIG. 6b, first, the first polycrystalline silicon layer (PA) 24, having a thickness of about 3000 AÅ° (300 nm) to 5000 ° AÅ(500 nm), is formed on the above substrate by a normal chemical vapor deposition (CVD) process. Next, an n-type impurity substance is introduced into the polycrystalline silicon layer 24 by, for example, an ion implantation process, to give the polycrystalline silicon layer 24 an n⁺-type conductivity.

Figure 6C:
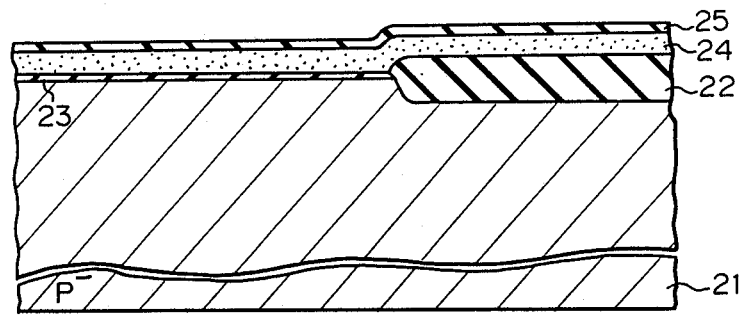

In FIG. 6c, the layer 25 of silicon oxide or silicon nitride, which has a thickness of about 2000 ° A Å(200 nm) and may be a part of the first insulating layer, is formed on the polycrystalline silicon layer 24 by, for example, the CVD process.

In FIG. 6d, first, by applying a normal patterning such as photo-lithography process the first insulating layers 25-1 to 25-4 of silicon oxide are respectively etched so as to form the conductive layers 24-1 to 24-4 as suitable for word lines. Next, the polycrystalline silicon layer 24 is etched, using the patterned silicon oxide layers 25-1 to 25-4 as the mask, to form the word lines 24-1 to 24-4. Third, the gate insulating layer 23 is etched by using as the mask, for example, the insulating layers 25-1 to 25-3 and the word lines 24-1 and 24-2, to expose regions 42-1 and 42-2, which may be a source forming region and a drain forming region, on the $p^-$-type silicon semiconductor substrate 21. Simultaneously, the field insulating layer 22 between the word lines 24-3 and 24-4 thereon is also etched to a depth equal to the thickness of the gate insulating layer 23.

In FIG. 6e, a silicon oxide layer 26 as a second insulating layer having a thickness of about 6000 ° Å Å(600 nm) is formed on the whole surface by the CVD process.

In FIG. 6f, the resist process used in normal photolithography is applied and a photo resist protection layer 27 is formed above the word lines, for example, the word lines 24-3 and 24-4, on which further stacked capacitors can be formed.

Figure 6G:
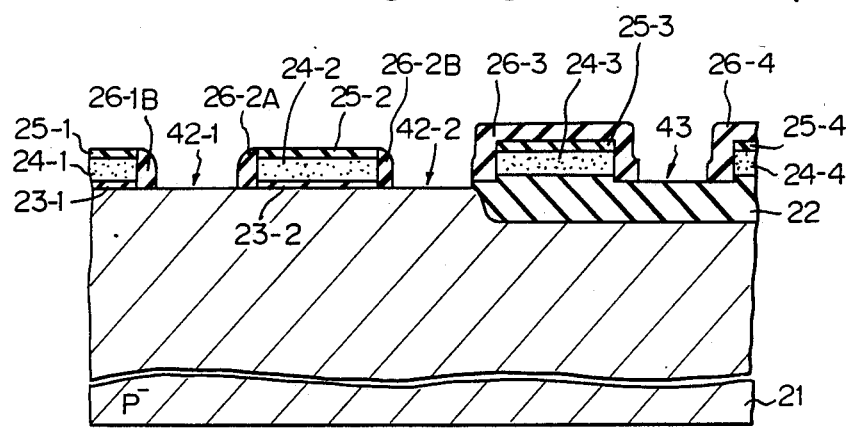

In FIG. 6g, a dry-etching process having an anisotropic etching effect in the vertical direction with respect to the substrate plane, such as a reactive ion etching (RIE) process, is applied and the whole surface is etched to reexpose the regions 42-1 and 42-2 which can be used as the source forming region and the drain forming region in the $p^-$-type silicon semiconductor substrate 21, and a region 43 between the word lines 24-3 and 24-4. As a result, the word lines 24-1 and 24-2 are covered by the silicon oxide layers 25-1 and 25-2 as the first insulating layers and the silicon oxide layers 216-1A (not shown) and 216-1B, and 26-2A and 26-2B, at the sides thereof, respectively. The word lines 24-3 and 24-4, on which the stacked capacitors may be further formed, are directly covered by the silicon oxide layers 25-3 and 25-4, and are also covered by the silicon oxide layers 26-3 and 216-4, together with the silicon oxide layers 25-3 and 25-4, respectively.

Figure 6H:
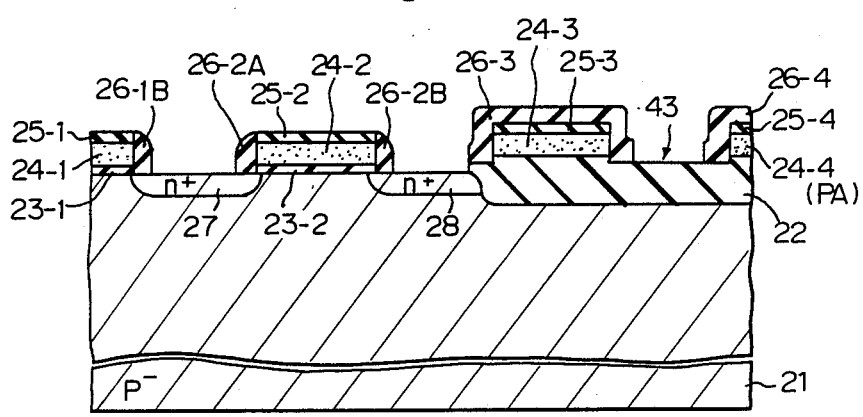

In FIG. 6h, by applying a selective ion-injection of the n-type impurity of the ion implantation process to the regions 42-1 and 42-2, an $n^+$ type impurity diffusion region 27, which may become a source, and another $n^+$-type impurity diffusion region 28, which may become a drain, or vice-versa, are formed in the $p^-$-type silicon semiconductor substrate 21.

Figure 6I:
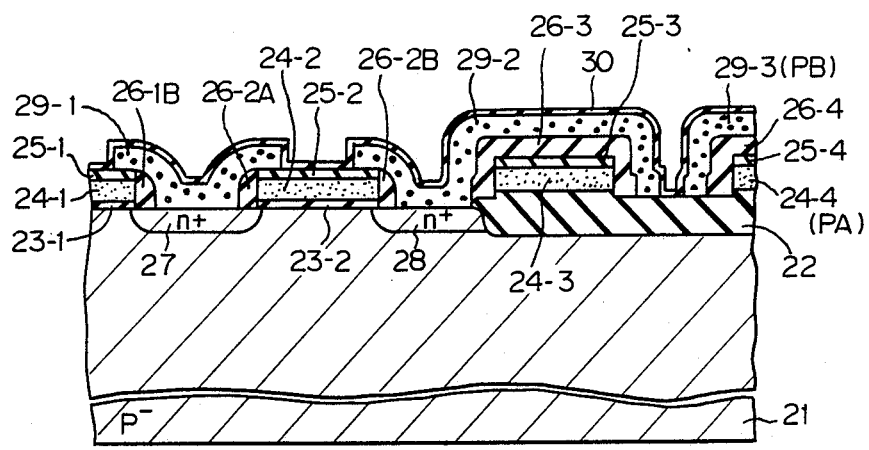

In FIG. 6i, first, the second conductive layer 29 of polycrystalline silicon (PB) having a thickness of about 1000 Å(100 nm) to 3000 Å(300 nm) is formed on the substrate shown in FIG. 6h by the CVD process. Next, the conductive layer 29 is ion-injected with the n-type impurity to make it conductive. Note that a portion which may act as an island-form conductive layer (region) 29-1 is formed simultaneously with the conductive layers 29-2 and 29-3 by the above processes. Then, by applying normal photo-lithographic technology, the polycrystalline silicon layer (PB) 29 is patterned to form the electrodes 29-2 and 29-3 for the capacitors C2 and C3 shown in FIG. 5, which, on the one hand, are in direct contact with the diffusion region 28 and, on the other hand, extend over the adjacent word lines 24-2 and 24-3 via the first insulating layers 25-2 and 2-3 and the second insulating layers 26-14 2B, 26-3 and 216-4, to form the island-form conductive layer 29-1, which, on the one hand, is in direct contact with the diffusion region 27 and, on the other hand, faces the adjacent word lines 24-1 and 24-2 through the first insulating layers 25-1 and 25-2 and second insulating layers 216-1B and 26-2A enclosing the word lines 24-1 and 24-2. Note that the island-form conductive layer 29-1 extends over the adjacent word lines 24-1 and 24-2. This facilitates self-alignment for forming the contact window 34 in the subsequent process after the layer insulation film 33 and the third insulating layer 30 are formed.

In addition, by applying the CVD process, the third insulating layer 30 of silicon oxide having a thickness of about 200 Å (20 nm) is formed on the capacitor electrodes 29-2 and 29-3, the second insulating layers 26-3 and 216-4, the first insulating layers 25-1 and 25-2, and the island-form conductive layer 29-1. Portions of the insulating layer 30 on the capacitor electrodes 29-2 and 29-3 function as a dielectric film for the memory capacitors and the other portions function as a layer insulation.

Figure 6J:
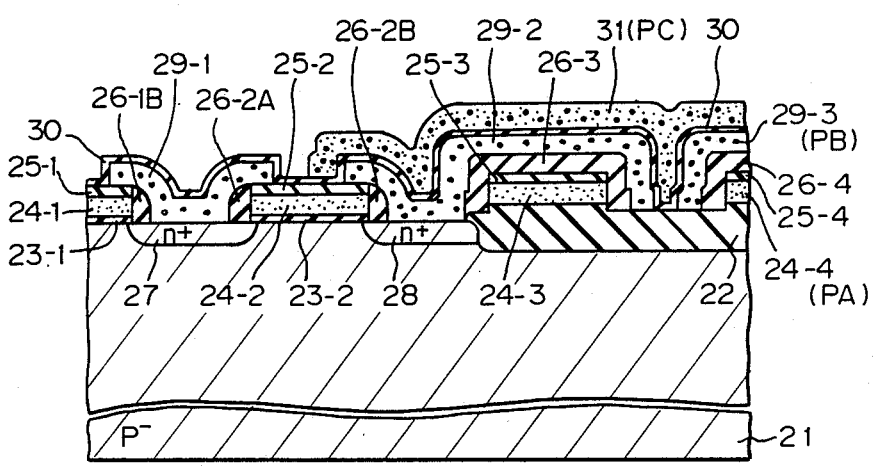

In FIG. 6j, first, the polycrystalline silicon layer (PC) having a thickness of approximately 1000 Å (100 nm) to 3000 Å (300 nm) is formed on the substrate shown in FIG. 6i by the CVD process. Next, the ion-implantation process is effected to make the polycrystalline silicon layer (PC) conductive, thus forming the third conductive layer 31.

After that, to remove the portion of the third conductive layer 31 above the island-form conductive layer 29-1, and form an electrode 31 opposing the electrodes 29-2 and 29-3 through the third insulating layer 30, the polycrystalline silicon layer (PC) is selectively patterned by a normal photo-lithography process.

Figure 6K:
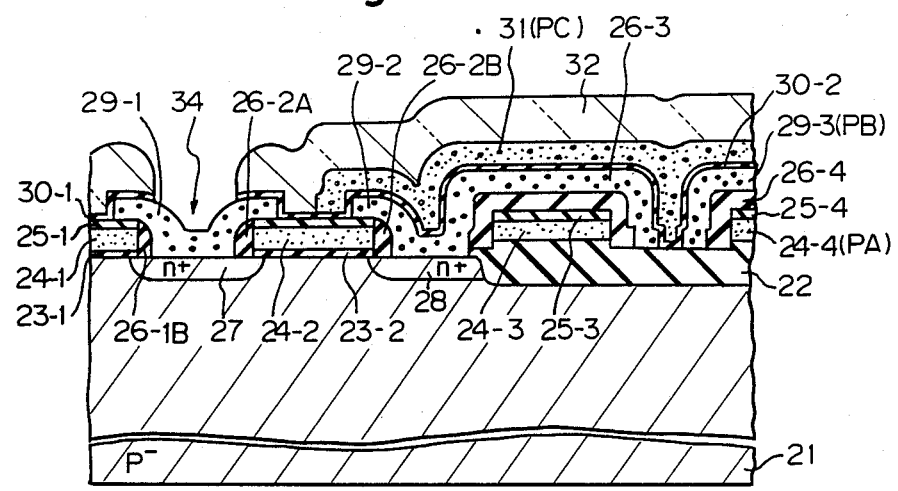

In FIG. 6k, the layer insulation film 32 of, for example, phosphosilicate glass having a thickness of approximately 8000 Å (0.8 μm) to 10000 Å (1 μm), is formed on the remaining portion of the third conductive layer 31 acting as the electrodes opposing the electrodes 29-2 and 29-3, by the CVD process. Next, the contact window 34, passing through the layer insulation film 32 and the remaining third insulating layers 30-14 1 and 30-2 to the island-form conductive region 29-1, is formed by a normal etching process, such as photo-lithography. As a result, part of the island-form conductive region 29-1 is exposed. A thermal treatment process, i.e., glass flow process, is effected to smooth the surface of the layer insulation film 32.

Figure 6L:
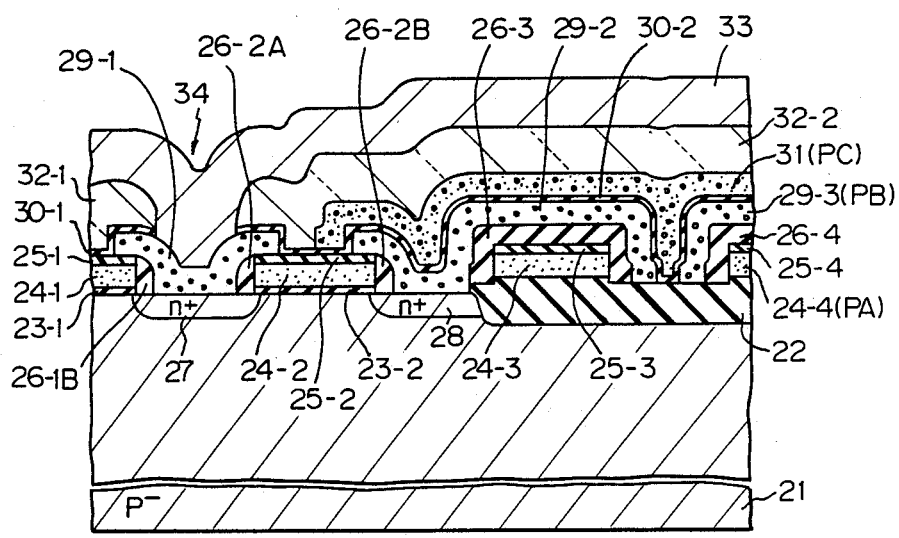

In FIG. 6l, in accordance with the deposition process, the sputtering process, or the like, a layer of wiring material, for example, aluminum, is formed on the substrate. This is patterned in a normal manner to form the bit line 33 resistively connected (in ohmiccontact) to the diffusion region 27, at the contact window 34, by way of the island-form conductive region 29-1.

Returning to FIG. 6j, the formation of portions adjacent to the island-form layer 292 will now be described in detail with reference to FIGS. 7a to 7c.

Figure 7A:
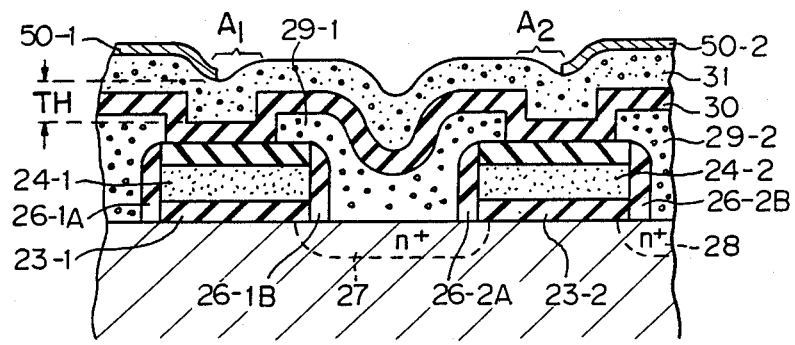
FIGS. 7a to 7c are enlarged sectional views explaining the manufacturing process of the semiconductor memory device shown in FIG. 5.
Figure 7B:
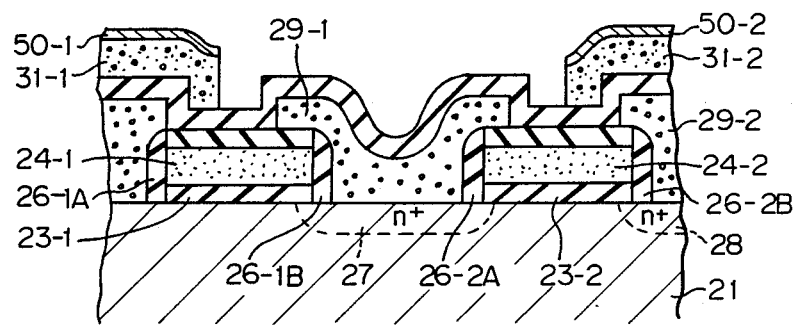
Figure 7C:
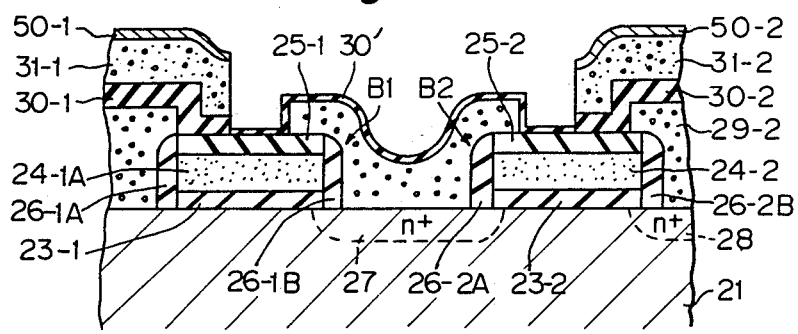

FIG. 7a to 7c are enlarged sectional views of the island-form conductive layer 29 and regions adjacent thereto.

In FIG. 7a, masks 50-1 and 50-2 are placed on the third conductive layer 31 except above the island-form conductive region 29-1 and adjacent portions, for example, $A_1$ and $A_2$ in FIG. 4. After that, etching is effected, whereby the third conductive layer 31, having a thickness of approximately 2000 Å (200 nm), above the island-form conductive region 29-1 is removed, as shown in FIG. 7b, exposing the surface of the second insulating layer 30 on the island-form conductive region 29. Approximately 2000 °Å (200 nm) of the portions of the third conductive layer 31 at the adjacent portions $A_1$ and $A_2$ is also removed simultaneously.

Note, the thickness TH of the third conductive layer 31 at the adjacent portions $A_1$ and $A_2$ is larger than that above the island-form conductive region 29-1, because the former conductive layer is formed along the outer and vertical wall of the second insulating layer 25. Accordingly, it has a considerably large thickness of, for example, approximately 6000 Å to 7000 Å (600 nm to 700 nm). Therefore, the etching process must be continued until the third conductive layer 31 at the adjacent portions is fully removed. The removal of the third conductive layer 31 is unavoidably accompanied by erosion of the third insulating layer 30 on the first insulating layers 25614 1 and 25-2 and the island-form conductive region 29-1. However, the speed of removal of the third insulating layer 36 is much lower than that of the third conductive layer 31. Therefore, while the thickness of the third insulating layer is reduced as shown in FIG. 7c, in the etching process of the third conductive layer 31, a small thickness of the third thin insulating layer 30' on the island-form conductive region 29-1 remains. Thus, the island-form insulating region 29-1 and corners B₁ and B₂ of the second insulating layers 216-1B and 26-4 2A are not completely removed.

Upon completion of the above processes, the masks 50-1 and 50-2 are removed.

Figure 8:
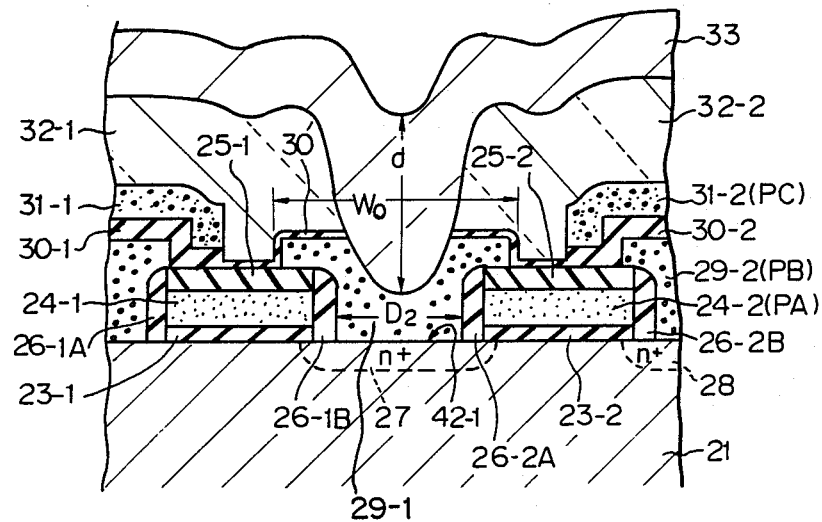
FIG. 8 is an enlarged view of the semiconductor memory device shown in FIG. 6l.

FIG. 8 is an enlarged sectional view of the semiconductor device after completion of the process shown in FIG. 6. A center portion of the third thin insulating layer 30' is removed together with a top of the island-form layer 29-1 during the etching process described in FIG. 6k. Note, first, that there is essentially no possibility of connection between the bit line 33 and the word lines 24-1 and 24-2, and next, that the distance D₂ between the adjoining word lines 24-1 and 24-2 can be reduced without detrimental effect on the connection between the bit line 34 and the diffusion region 42-1 due to the island-form conductive region 29-1 extending over the first insulating layers 25-1 and 25-2 and the second insulating layers 216-1B and 26-2A over the word lines 24-1 and 24-2 and having the width W₀. In other words, even if the distance D₁ (not shown) between the adjoining first insulating layers 25-1 and 25-2 is somewhat shorter than the length of the diffusion region 27, the width W₀ within which the contact window 34 is to be formed may be made substantially equal to the distance defining the adjoining word lines in the prior art. This allows high integration of the semiconductor device without the need for other processes.

In addition, the depth d of the bit line 33 at the contact window 34 is reduced due to the existence of the island-form conductive region 29-1. This decreases the possibility of disconnection of the bit line around the steps of the contact window edge.

Finally, the insulating layer for protection of the surface of the semiconductor device, of phosphosilicate glass or the like, is formed and the finishing process effected to produce the semiconductor device including the stacked-capacitor type memory cells as shown in FIG. 5.

In a semiconductor memory device including a plurality of stacked-capacitor type memory cells, wiring contact portions of sources and drains of transistors in peripheral circuits including sense amplifiers each consisting of transistors can be formed in the same construction as the above-mentioned memory cell portion. In this case, however, as the above island-form conductive layer overlaps the gate electrode, the capacitance of the gate of the transistors in the sense amplifier may increase and so the characteristic of the transistor would change. To avoid this, the wiring contact portions in question are formed in a normal construction. The processes for manufacturing the peripheral circuits, particularly the transistor portion, will be explained with reference to FIGS. 9a to 9f.

Figure 9A:
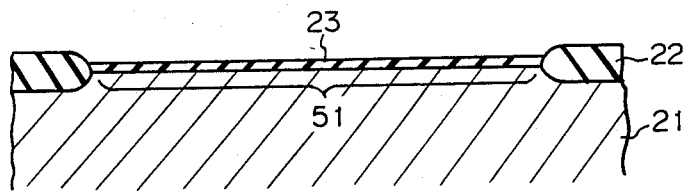
FIGS. 9a to 9f are sectional views explaining the production of other parts in the semiconductor memory device shown in FIG. 3.

In FIG. 9a, the field oxide layer 22 is formed on the p⁻-type silicon substrate 21, and a transistor-forming region 51 is exposed simultaneously. The gate oxide insulating layer 23 is also formed simultaneously. The process corresponds to that of FIG. 6a.

Figure 9B:
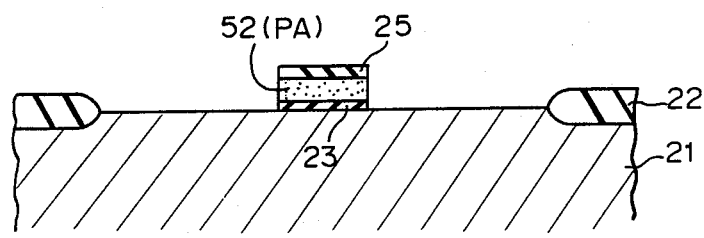

In FIG. 9b, a first polycrystalline silicon layer (PA) 52 is formed above the substrate. Then, the first polycrystalline silicon layer 52 is rendered electrically conductive by n-type impurity implantation. Part of the first insulating layer 25 is formed on the polycrystalline silicon layer 52. Next, patterning is applied to form the gate electrode, also referenced as 52, on which the first insulating layer 25 is formed. The process corresponds to that of FIG. 6d.

Figure 9C:
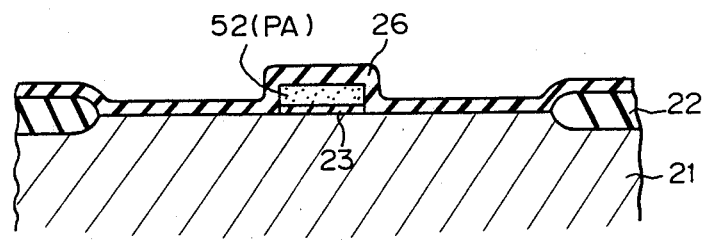

In FIG. 9c, the second insulating layer 26 is formed on the portions of the substrate 21 and the field oxide layer 22 from which it was removed during the above patterning process. This process corresponds to that of FIG. 6e.

Figure 9D:
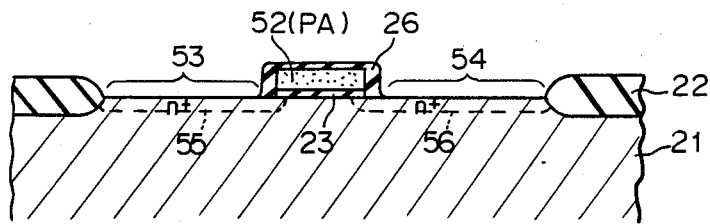

Subsequent to this, but before the process shown in FIG. 9d, various processes are effected. The first insulating layer 25 arranged in the memory cell forming region is etched and ion-implantation performed, as in FIG. 6g. The peripheral regions are protected and remain as is (as shown in FIG. 9c).

Next, in the same process as shown in FIG. 6i, the second polycrystalline silicon layer (PB) 29 is deposited on the peripheral regions. However, the portion of the polycrystalline silicon layer deposited on the peripheral regions is fully removed during the patterning process. As a result, the peripheral regions are again made as shown in FIG. 9c.

Furthermore, during the same process as shown in FIG. 6j, the third conductive layer of polycrystalline silicon (PC) 31 is deposited on the peripheral regions. Again, however, the deposited polycrystalline silicon layer is completely removed during the subsequent patterning process. At this stage, the upper layer of the insulating layer 26 on the conductive layer 52 is also eroded, as mentioned above with reference to FIGS. 6j and 7a to 7c.

In FIG. 9d, prior to performing the process shown in FIG. 6k, the memory cell region is covered with a protective mask. Subsequently, the portions of the second insulating layer 26 on the peripheral regions are entirely removed by the reactive ion-etching process, thus exposing transistor source- and drain-forming regions 53 and 54. The portion of the insulating layer 26 enclosing the gate electrode 52 remains. Furthermore, an n⁺-type impurity is ion-implanted into the source- and drain-forming regions 55 and 56, thereby forming n⁺-type source and drain regions 55 and 56.

Figure 9E:
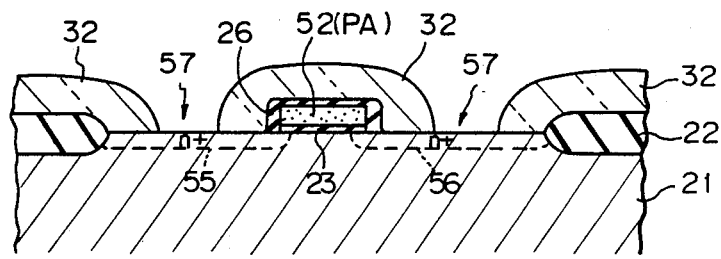

In FIG. 9e, during the process shown in FIG. 6k, the layer insulation film 32 of phosphosilicate glass is formed above the peripheral regions. Subsequently, contact windows 57 are formed in the source and drain regions 55 and 56.

Figure 9F:
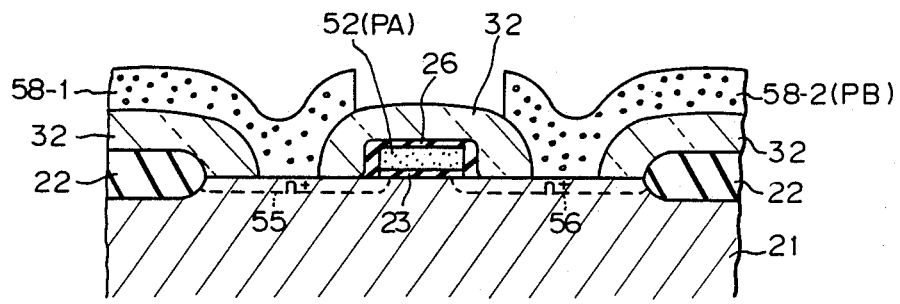

In FIG. 9f, during the process shown in FIG. 6l, a wiring layer 58 is formed on the layer insulation film 32 and the apertured portions of the source and drain regions 55 and 56. Next, the wiring layer 58 is separated above the conductive layer 52 to form wiring layers 58-1 and 58-2.

After that, the memory cell regions, surface protecting insulating film, etc., are formed.

In the above embodiments, the first conductive layer, used for the word line or the gate electrode, and the second and third conductive layers, used for the capacitor electrodes, are made of polycrystalline silicon. These layers particularly the first conductive layer, also may be made of the high melting point metals, which can provide a low sheet resistance, or the like.

The first and second insulating layers can be formed of thermal oxide films.

Note that a p-type semiconductor substrate is used in the above-mentioned embodiments. However, obviously, an N-type substrate can be used instead.

In the above embodiments, metal oxide semiconductor (MOS) devices were described, however, the present invention may be applied to MIS devices.

Many widely different embodiments of the present invention may be constructed without departing from the spirit and scope of the present invention. It should be understood that the present invention is not limited to the specific embodiments described in this specification, except as defined in the appended claims.

We claim:

1. A semiconductor memory device comprising:
   a substrate;
   a plurality of word lines;
   a plurality of bit lines intersecting said word lines; and
   a plurality of memory cells, each of said memory calls positioned at an intersection defined by one of said word lines and one of said bit lines and including a capacitor for storing data and a transistor, operatively connected to said capcitor, for transferring data to said capacitor;
   said word lines being formed by a first conductive layer, said transistor in each of said memory cells including a gate formed by said first conductive layer and connected to a first one of said word lines, a gate insulting layer, and source and drain regions, each of said memory cells including:
   a first insulating layer covering said gate of said transistor; and
   a second insulating layer covering a second one of said word lines adjacent to said first one of said word lines and being thicker than said first insulating layer covering said gate;
   said capacitor in each of said memory cells including:
   a second conductive layer which is in contact with one of aid source and drain regions of said transistor in each of said memory cells, extending over the gate of said transistor on said first insulating layer and covering said second insulating layer;
   a third insulating layer formed on said second conductive layer;
   a third conductive layer extending over said third insulating layer, one of said bit lines being connected to the other one of said source and drain regions of said transistor in each of said memory cells; and
   a fourth insulating layer formed between said third conductive layer and said one of said bit lines, said one of said bit lines having portions extending above and over said gate covered by said first insulating layer, said fourth insulating layer formed under the extending portions of said one of said bit lines.

2. A semiconductor memory device according to claim 1, wherein said second insulating layer is also provided on both sides of said gate, wherein said first insulating layer is also provided on said adjacent word line, and wherein said second insulating layer is provided on said first insulating layer over said adjacent work line, so as to electrically isolate each of said work lines from said bit lines and said second conductive layer.

3. A semiconductor memory device according to claim 2, wherein said first insulating layer is made of silicon oxide or silicon nitride and has a thickness of approximately 200 nm (2000 Å), and wherein said second insulating layer is made of silicon oxide or silicon nitride and has a thickness of approximately 400 nm (40000 Å).

4. A semiconductor memory device according to claim 3, wherein said device further comprises an additional conductive layer directly connected to the other of said source and drain regions of said transistor in each of said memory cells and extending over the gate of the adjoining transistors through said first insulating layer covering said gate, each of said bit lines being connected to the other of said source and drain regions through said additional conductive layer.

5. A semiconductor memory device according to claim 4, wherein said additional conductive layer, formed on the other of said source and drain regions of said transistor and extending over the gate of the adjoining transistors through said first insulating layer means covering said gate, has a predetermined thickness at the portion extending over the gate of the adjoining transistors and a predetermined width to ensure formation of a contact window for electrically connecting each of said bit lines with the other of said source and drain regions through said additional conductive layer.

6. A semiconductor memory device according to claim 5, wherein the thickness of said additional conductive layer is approximately equal to that of said second conductive layer.

7. A semiconductor memory device according to claim 6, wherein second conductive layer in each of said memory cells extends over one of said adjacent word lines other than its own gate.

8. A semiconductor memory device according to claim 7, wherein said semiconductor memory device further includes wiring lines and a peripheral circuit including transistors, each having source and drain regions and a gate electrode entirely covered by said second insulating layer, said source and drain regions being directly connected to said wiring lines.

* * * * *

UNITED STATES PATENT AND TRADEMARK OFFICE
CERTIFICATE OF CORRECTION

PATENT NO. : 4,905,064

DATED : FEBRUARY 27, 1990

INVENTOR(S) : TAKASHI YABU ET AL.

It is certified that error appears in the above-identified patent and that said Letters Patent is hereby corrected as shown below:

FRONT PAGE [57] ABSTRACT, line 25, "convering" should be --covering--.

Col. 1, between lines 6 and 7, please insert the following section which was inadvertently omitted by the Patent Office:

--The present invention relates to a metal insulator semiconductor (MIS). More particularly, it relates to a MIS dynamic semiconductor memory device having stacked-capacitor type memory cells.--.

Col. 2, line 19, "cell" should be --cells--.
line 55, "X-X" should be --X-X'--;
line 56, "'in" should be --in--.

Col. 3, line 18, "$\overline{bl}_0$," should be --$\overline{BL}_0$,--;

line 20, "$\overline{bl}_0$" should be --$\overline{BL}_0$--;

line 23, "$\overline{bl}_0$" should be --$\overline{BL}_0$--;

line 25, "transfergate" should be --transfer-gate--;
line 28, "transfergate" should be --transfer-gate--.

line 30, "$\overline{bl}$and" should be --$\overline{BL}$ and--;
line 50, "11-2a," should be --11-2, a--;

UNITED STATES PATENT AND TRADEMARK OFFICE
CERTIFICATE OF CORRECTION

PATENT NO. : 4,905,064
DATED : FEBRUARY 27, 1990
INVENTOR(S) : TAKASHI YABU ET AL.

It is certified that error appears in the above-identified patent and that said Letters Patent is hereby corrected as shown below:

```
Col. 4, line 19, "he" should be --the--.

Col. 5, line  7, "216-1A" should be --26-1A--; and
                 "216-1B" should be --26-1B--;
        line 46, "216-1B" should be --26-1B--;
        line 62, "nd" should be --and--;
        line 64, "6-4" should be --26-4--.

Col. 6, line  3, "6000 ° Å(0.6 µm)" should be --6000 Å
                 (0.6 µm)--;
        line 15, "216" should be --26--;
        line 16, "216-1B" should be --26-1B--;
        line 18, "216-1B" should be --26-1B--;
        line 43, "1. 41" should be --. 41--;
        line 47, "3000 AÅ °" should be --3000 Å--;
        line 48, "5000 ° AÅ" should be --5000 Å--;
        line 56, "2000 ° A Å" should be --2000 Å--.

Col. 7, line  9, "6000 ° AÅ" should be --6000 Å--;
        line 27, "216-1A" should be --26-1A--; and
                 "216-1B" should be --26-1B--;
        line 32, "216-4" should be --26-4--;
        line 57, "26-142B" should be --26-2B--; and
                 "216-4" should be --26-4--;
        line 62, "216-1B" should be --26-1B--.

Col. 8, line  5, "216-4" should be --26-4;
        line 30, "30 14 1" should be --30-1--;
        line 45, "292" should be --29-2--;
        line 59, "2000 °Å" should be --2000 Å--.
```

UNITED STATES PATENT AND TRADEMARK OFFICE
CERTIFICATE OF CORRECTION

PATENT NO.  : 4,905,064  
DATED       : FEBRUARY 27, 1990  
INVENTOR(S) : TAKASHI YABU ET AL.

It is certified that error appears in the above-identified patent and that said Letters Patent is hereby corrected as shown below:

Col.  9, line  7, "25614 1" should be --25-1--;  
         line  9, "36" should be --30--;  
         line 17, "216-1B and 26-4 2A" should be --26-1B and 26-2A--;  
         line 33, "216-1B" should be --26-1B--.

Col. 11, line 24, "calls" should be --cells--;  
         line 28, "capcitor" should be --capacitor--;  
         line 33, "a first" should be deleted;  
         line 34, "insulting" should be --insulating--;  
         line 44, "aid" should be --said--.

Col. 12, line 12, "work" (both occurrences) should be --word--;  
         line 21, "(40000 Å)." should be --(4000 Å).--.

Col. 7, line 56, "2-3" should be --25-3--.

Signed and Sealed this

Ninth Day of April, 1991

*Attest:*

HARRY F. MANBECK, JR.

*Attesting Officer*     *Commissioner of Patents and Trademarks*